United States Patent [19]

Shirato et al.

[11] Patent Number: 4,710,791
[45] Date of Patent: Dec. 1, 1987

[54] PROTECTION DEVICE IN AN INTEGRATED CIRCUIT

[75] Inventors: Takehide Shirato, Hiratsuka; Shinichi Sekine, Yokohama, both of Japan

[73] Assignee: Fujitsu Limited, Kanagawa, Japan

[21] Appl. No.: 760,368

[22] Filed: Jul. 30, 1985

[30] Foreign Application Priority Data

Aug. 9, 1984 [JP] Japan .................. 59-166823

[51] Int. Cl.[4] ........................................... H01L 29/78
[52] U.S. Cl. .................... 357/23.13; 357/59; 357/51; 361/56; 361/91
[58] Field of Search ............ 357/23.13, 59 F, 51; 361/56, 91

[56] References Cited

U.S. PATENT DOCUMENTS

| 4,133,000 | 1/1979 | Greenstein | 357/51 |
| 4,167,804 | 9/1979 | Greenstein | |
| 4,189,739 | 2/1980 | Copeland | 357/51 |
| 4,609,935 | 9/1986 | Kondo | 357/51 |

FOREIGN PATENT DOCUMENTS

| 54-101283 | 8/1979 | Japan | 357/23.13 |
| 57-130468 | 8/1982 | Japan | 357/23.13 |
| 58-123768 | 7/1983 | Japan | 357/51 |
| 2103877 | 2/1983 | United Kingdom | 357/23.13 |
| 2113468 | 8/1983 | United Kingdom | |

OTHER PUBLICATIONS

Patent Abstracts of Japan, vol. 8, No. 221, Oct. 1984, Abstract of Miyagawa Patent Publications 59-104171, 6/15/84.

Primary Examiner—Andrew J. James
Assistant Examiner—Mark Prenty
Attorney, Agent, or Firm—Armstrong, Nikaido, Marmelstein & Kubovcik

[57] ABSTRACT

An I/O protection device which protects the IC from noise especially from static charge break down is disclosed. A resistance body made from polysilicon is provided between the I/O pad and I/O circuit of the IC. The resistance body may be formed over the gate oxide or field oxide layer. Beneath the resistance body is formed a diffusion region having an opposite conductivity type to that of the substrate. The diffusion region is connected electrically in parallel to the resistance body. In some cases, the diffusion region may be connected at only one point.

7 Claims, 9 Drawing Figures (a)

(b)

(c)

PROTECTION DEVICE IN AN INTEGRATED CIRCUIT

BACKGROUND OF THE INVENTION

The present invention relates to a protection device for an integrated circuit (IC) which protects the input and/or output (I/O) circuits of the IC from noise. More precisely it protects the IC from static charge break down.

Recent ICs especially MOS (metal oxide semiconductor) type ICs are provided with protection device between its input or output pads and I/O circuits, to prevent the damage caused by noise picked up by input or output signal lines or voltage supply lines. Such protection is increasing its importance as the integration rate of the IC becomes high. It is especially important for an MOS IC, since it becomes very susceptible to noise as the gate oxide layer and the diffusion layer are becoming very thin and shallow to increase the packing density of devices in the chip.

Usually the I/O protection device utilizes a diffusion layer of impurities in a substrate as the protection element of the IC. A typical example of a prior art protection circuit is given in FIG. 6 showing its cross sectional view schematically. In the figure, the reference numeral 1 designates an n-type silicon substrate. 2 is a p$^-$-type well which is lightly doped with p-type impurity to fabricate a complementary device in it. 3 and 4 are respectively a p$^+$-type and an n$^+$-type diffusion layers which are used as resistive elements. These elements are coated with an insulation layer 5 composed of a silicon dioxide (SiO$_2$) layer for example, and wired to an I/O pad or the I/O circuit (not shown) with an aluminum wiring layer 6 for example.

A surge protection device of such configuration blunts the wave form of input noise by the CR time constant which is composed of the capacitance (C) and resistance (R) of the diffusion layer. The capacitance C is composed of the junction capacity of a diode between the diffusion layers and the substrate or the well regions.

But the effect of such prior art noise protection devices is becoming inadequate for recent highly integrated ICs. Because the diffusion layers 3 or 4 are fabricated in an IC with a same process at the same time to fabricate the source or drain regions of MOS devices for example, so the diffusion depth becomes shallow as the the integration rate increases, and it tends to be short circuited between the wiring line 6 and the substrate 1 or the well region 2 by high current produced by noise. Moreover as the sheet resistivity of the diffusion layer 3 increases, it has an adverse effect on the high speed operation of the IC.

Recently to overcome such problems, a resistive material of poly-crystalline silicon (polysilicon) has came to be used for fabricating the resistive element. FIG. 7 shows schematically an example of such a protection device illustrating its structure by a cross sectional view. In the figure, 11 is a semiconductor substrate, 15 is an oxide layer covering its surface, 7 is the polysilicon resistive element, 16 is a thin oxide layer covering its surface, 5 is an insulating layer to passivate the surface of the device, such as phospho-silicate glass (PSG) for example, and 6 is a wiring line to connect the resistive element 7 to the bonding pad or to the I/O circuit.

Such structure has the merits of having a lower resistivity of the resistive element 7, and improved characteristics of high speed operation of the circuit. But it has also a disadvantage in that it is difficult to provide enough capacitance between the resistive element 7 and the substrate 11 to provide enough CR value for blunting the noise, because the resistive element 7 is fabricated on the oxide layer 15. Therefore it becomes difficult to make the size of the resistive element 7 small.

The protection devices having a structure like FIG. 7, therefore, often suffer from the problem that the contact part of the wiring line to the polysilicon resistive element is melted, or a leakage current is increased by defects generated in the oxide layer beneath the resistive element by temperature caused by high voltage induced on the outer wiring line.

SUMMARY OF THE INVENTION

An object of the present invention, therefore, is to prevent the destruction of the protection device by the melting or breakdown at the junction area of the circuit elements caused by noise or static charge.

Another object of the present invention is to improve the durability of an IC, especially an LSI (large scale integrated circuit), for the static charge break down.

A further object of the present invention is to provide a noise protection device which does not need large area on a chip and still has high protection effect from static charge breakdown for the IC, especially for an LSI.

Such objects can be attained by connecting the I/O pads and the I/O circuits by a resistance body which is insulated from the substrate, and providing a diffusion layer having opposite type conductivity to the substrate underneath the insulation layer of said resistance body.

Taking such configuration, even if there occurred a defect in the isolation layer beneath the resistance body, the leakage current between the resistance body and the substrate is suppressed by the diode between the diffusion layer and the substrate. Moreover, by connecting the diffusion layer to the resistance body, the capacitance between the resistance body and the substrate is increased by the capacitance between the diffusion layer and the substrate, so the sharp pulse noise is blunted. Such combined effects increase the durability of the IC to the noise and static charge break down to a large extent.

Further objects and advantages of the invention will be apparent from the detailed description to follow taken in conjunction with the appended claims.

(b) illustrates schematically a top view of the pattern of the circuit appearing on the surface of the substrate; and (c) shows an equivalent circuit of the protection device.

Figure 2:
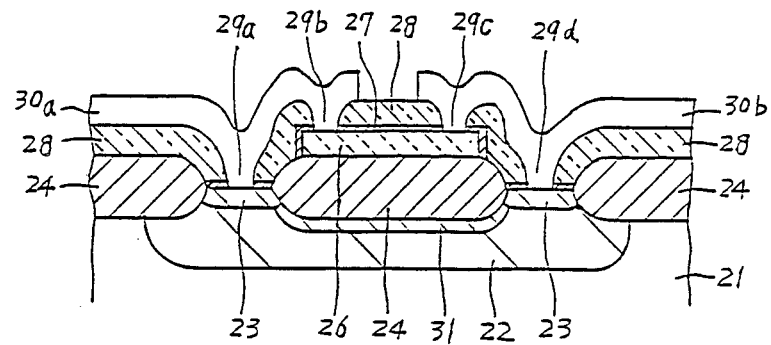

FIG. 2 shows schematically a cross section of a second embodiment of the protection device of the present invention, illustrating a case where the circuit is fabricated on a field oxide layer of the IC.

Figure 3:
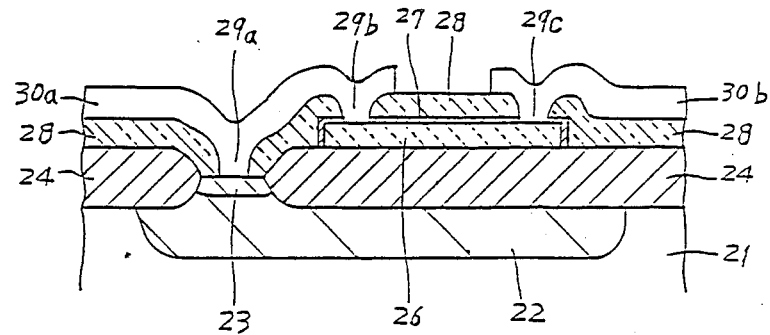

FIG. 3 shows a schematic cross section of a third embodiment of the protection device of the present invention, which is provided with a diffusion region beneath the resistance body connected to the resistance body through an opening.

Figure 4:
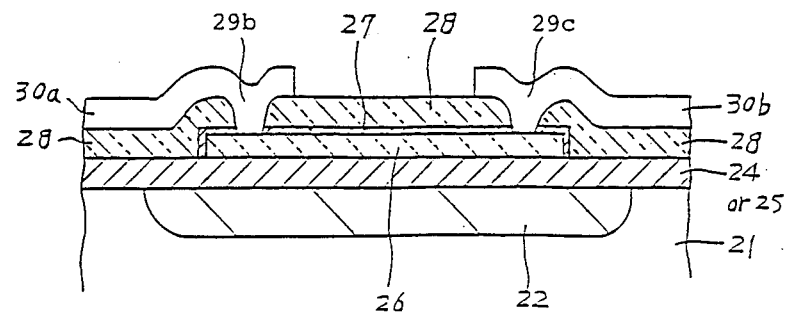

FIG. 4 shows a schematic cross section of a fourth embodiment of the noise protection device of the present invention, which is provided with a diffusion region that is not connected to the resistance body.

Figure 1:
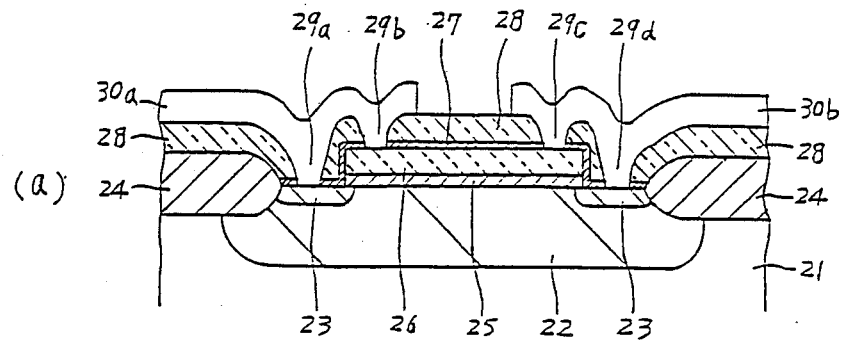
FIG. 1 shows an embodiment of a protection device of the present invention, in which (a) illustrates schematically a cross sectional view of the circuit.
Figure 1:
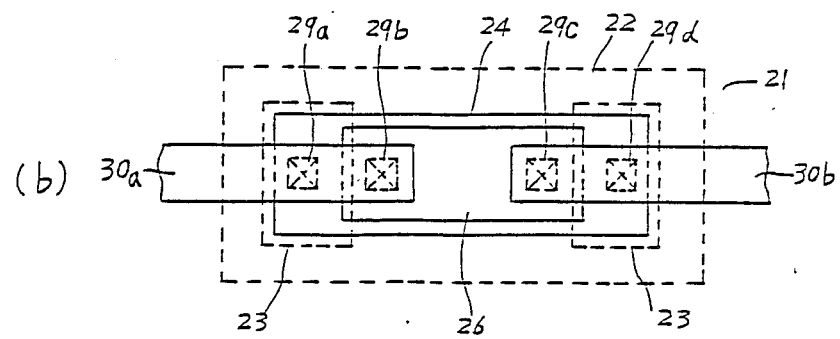
Figure 1:
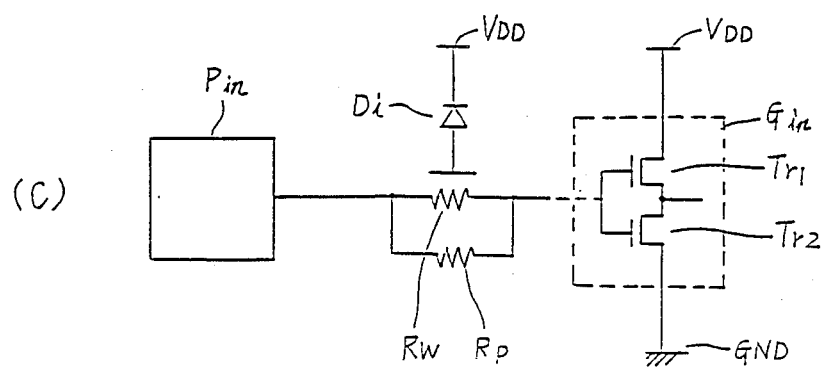
Figure 5:
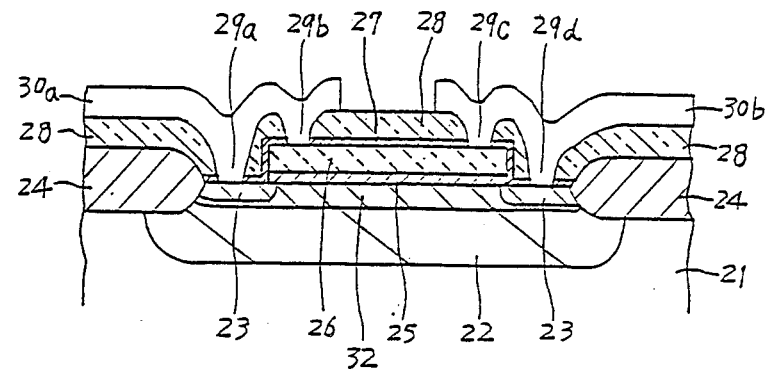

FIG. 5 shows a fifth embodiment of the protection device which is a modification of the circuit of FIG. 1, further comprising a high doped layer over the diffusion region and improving the protection ability.

Figure 6:
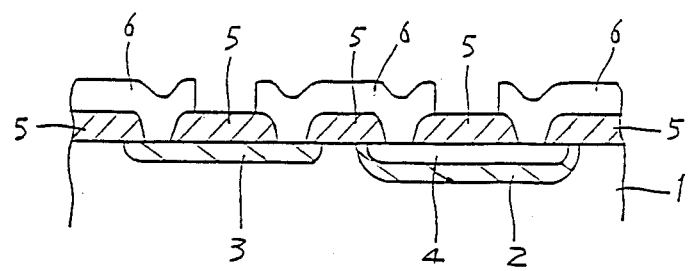

FIG. 6 is a schematic cross section of a prior art noise protection device.

Figure 7:
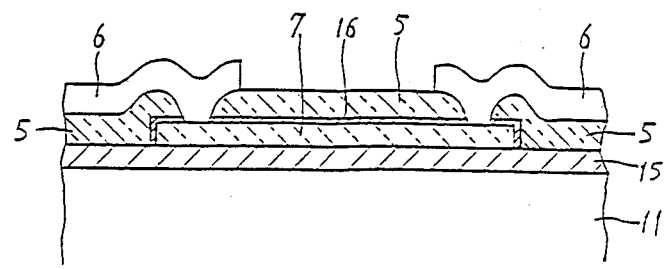

FIG. 7 shows another type of prior art noise protection circuit which is fabricated on an insulation layer.

Throughout the drawings same or like numerals designate same or corresponding parts.

DESCRIPTION OF PREFERRED EMBODIMENTS

An embodiment of a protection device of the present invention is shown in FIG. 1. In the figure, (a) shows a schematic sectional view of the circuit, (b) shows a top view of the circuit schematically, and (c) is an equivalent circuit diagram of the protection device.

This embodiment shows an example in which the protection circuit is fabricated over an active area of the IC. The explanation will be done briefly following the fabrication steps of the circuit. In the figures, 21 designates an n-type semiconductor substrate, and 22 is a $p^-$-type diffusion region having a thickness of about 3 $\mu$m and an impurity concentration of about $10^{16} \sim 10^{17}$ cm$^-$. They are fabricated in the substrate 21 with the same process at the same time when the wells for the transistors in the IC are fabricated. This $p^-$-type diffusion region 22 operates as a resistor and diode. For that purpose, $p^+$-type contact regions 23 are fabricated on both ends of the diffusion region 22. They are 3000~6000 Å thick and have an impurity concentration of about $10^{20}$ cm$^{-3}$, and are fabricated with the same process altogether at the same time as fabricating sources and drains of FETs in the IC.

24 is a field oxide layer which separates the devices from other circuit elements. 25 is a thin oxide film of about 350 Å usually called as gate oxide film because they are formed by the process used to fabricate a gate insulator film of FETs. The oxide layer 25 will be referred to as a first oxide layer hereinafter. Over the first oxide layer 25 is formed a resistance body 26 composed by polysilicon layer of approximately 4000 Å thick and sheet resistivity of about 30 ohms per square. This resistance body 26 operates as a series resistor between the I/O pad and I/O circuit. Also the first oxide layer 25 prevents the diffusion of dopant from high doped polysilicon to low doped $p^-$-type diffusion region 22.

Then the surface of the resistance body 26 is coated with a thin oxide layer 27 (it will be referred to as a second oxide layer hereinafter) made by ordinary thermal oxidation. Thickness of the second oxide layer 27 is about 1000 Å over the polysilicon 26 but its thickness is approximately 500 Å, since polysilicon is more oxidizable than single crystalline silicon of substrate. Subsequently, the surface of the device is covered with a phosphosilicate glass (PSG) layer 28 to protect it from the contaminations. The second oxide layer 27 prevents the diffusion of phosphor from the PSG into the polysilicon layer of 26, and $p^+$-type regions 23.

Subsequently, contact holes 29a, 29b, 29c and 29d are fabricated at each of the contact points, and these contact points are connected respectively to the I/O pad (not shown) and I/O circuit (not shown) by aluminum wiring patterns 30a and 30b. The above described processes are all familiar ones in ordinary semiconductor fabrications, so the details of the process are omitted for the sake of simplicity.

An example of the pattern of these elements can be seen in FIG. 1(b), which shows a top view of the pattern appearing on the surface of the IC chip. The size of the pattern is not critical, it may be varied to meet the space where the protection device is placed. Moreover, the shape of the pattern may be varied in order to fabricate the circuit in a space allotted for the protection device. Therefore, the shape or pattern may be curved or folded for example. If the resistive pattern 26 is shaped broader than as shown in the figure, it is advisable to shape the contact holes 29b etc. also elongated in the direction of the width of the resistive pattern 26, or there should be provided a plurality of contact holes to avoid concentration of the current. One example of the size of the resistance body 26 is 30×100 $\mu$m and the size of the diffusion region 22 (shown by a broken line because it is under the oxide layers) is 40×160 $\mu$m. Though the detailed measure of the pattern is not shown, it will be easy for the one skilled in the art to estimate the size from these data.

FIG. 1(c) is an equivalent circuit diagram of the protection device. As shown in the figure, the protection device is inserted between the I/O pad the I/O circuit of the IC. The figure shows the case when the protection device is inserted between the input pad $P_{in}$ and the input circuit $G_{in}$, which is encircled with a broken line. In the figure, Rp is a resistance of the polysilicon resistance body 26 and Rw is a resistance of the diffusion region 22. A diode Di is composed by the $P^-$-type diffusion region 22 and the n-type substrate 21. It is distributed in parallel to Rw and is biased in the reverse direction by the source voltage $V_{DD}$, since in such case the substrate 21 is usually supplied with a positive side source voltage $V_{DD}$. In FIG. 1(c), a circuitry $G_{in}$ encircled with a broken line is an input circuit of the IC. The input circuit in the figure is an inverter composed of series connected FETs Tr1 and Tr2. Of course, there are various kinds of I/O circuits, but these circuits are not within the of scope of the present invention, therefore, they will not be described further hereinafter.

In the following description, the disclosure will be given with respect to a protection device provided on the input side of the IC, namely the circuit is located between the input pad and the input circuit or input transistor. And the circuit is assumed to be fabricated on an n-type substrate. But it will be clear to a person skilled in the art, that an equivalent circuit may be applied to the output side of the IC and it may be fabricated on a p-type substrate after necessary replacement of the conductivity type materials.

In such protection device, the pulse noise induced in the input line 30a is blunted of the CR circuit composed by the junction capacity of $p^-$-type diffusion region 22 and the resistance of the resistance body 26. Further, the noise current is divided into the polysilicon resistance body 26 and the $p^-$-type diffusion region 22, therefore, the damage of the polysilicon resistance body 26 is reduced to a greater extent.

This type of protection device has various advantages compared to prior art circuits. Even if there exist some defects in the first oxide layer 25 caused by heating of polysilicon resistive layer 26 or imperfect oxidation for fabricating the gate oxide layer etc, there occurs no leakage current between the resistance body 26 and the substrate 21, since there is provided the p⁻-type diffusion region 22 underneath the first oxide layer 25.

The diffusion layer which provides the capacity C is composed of the p⁻-type diffusion region 22, therefore, it provides a high durability against the surge current by the above mentioned current dividing and blunting effect for the sharp pulse noise.

Generally, the sheet resistivity of the p⁻-type diffusion region is higher than that of the polysilicon layer of the resistance body 26 by an order of two, therefore, most of the signal current flows through the polysilicon layer 26, so the high speed characteristics of the IC are not affected by the protection device, compared to the prior art circuit.

FIG. 2 shows another embodiment of the protection device by the present invention, which is formed on a field region of the IC. Compared to FIG. 1, the protection device is formed on the field oxide layer 24. And in this circuit there is added a thin p-type layer 31 of about 0.6 $\mu$thick and having an impurity concentration of about $10^{17}$ cm$^{-3}$ underneath the field oxide layer 24. This layer is formed with a same process at the same time when forming a channel stoppers in the IC. The p-type layer 31 contributes to further decreasing the sheet resistivity of the p⁻-type diffusion region 22, and further improves the high frequency characteristics of the IC. By the insertion of the p-type layer 31, the break down voltage of the diode Di in FIG. 1(c) is not influenced, since it is determined by the break down voltage between the p⁻-type diffusion region and the substrate. Therefore, the durability against high voltage noise and the stability of the protection device are same to those of the circuit of FIG. 1.

FIG. 3 shows a third embodiment of the protection device by the present invention. In this embodiment, the p⁻-type diffusion region 22 is formed below the polysilicon resistance body 26, but it is connected only to the input side and is not connected to the output side. Namely, the p⁻-type diffusion region 22 is connected to the input wire 30a through the contact hole 29a, and also connected to the input side of the resistance body 26 through the contact hole 29b. In such circuit, the diffusion region 22 does not contribute as a parallel resistor Rw in the equivalent circuit of FIG. 1(c), but it contributes as the diode Di and the capacitor C. Therefore, the durability of the IC to high voltage noise is not varied so much from that of the circuit of FIG. 1. Since the resistance of the parallel resistor Rw in FIG. 1(c) is originally high compared to that of Rp, the effect of neglecting the resistance Rw of the high frequency characteristics, is small.

FIG. 4 shows a fourth embodiment of the protection device, in which the p⁻-type diffusion region 22 formed under the resistance body is not connected at all to the resistance body 26, compared to FIG. 3. In this case, the leakage current between the resistance body 26 and the substrate 21 is suppressed by the same reason described with respect to FIG. 1. But the capacitance C between the resistance body 26 and the substrate 21 is not increased by that of the diffusion region 22, so the effect of blunting the high voltage noise is reduced. Therefore, the size of the resistance body 26 and the diffusion region 22 should be designed large compared to the previous embodiments, in order to provide enough capacitance. In such case, it is advisable to increase the number of contact holes 29b and 29c or shape them elongated in the direction perpendicular to the length of the resistance body (in the direction vertical to the paper), in order to decentralize the current flow at the contact hole and prevent heat damage at these points.

Comparing the protection device for FIG. 4 to those of FIGS. 1~3, the durability of the circuit to the high voltage noise is reduced to some extent, but it has still enough high voltage durability compared to prior art circuits, because it is provided with the p⁻-type diffusion region 22 whose break down voltage is high. On the contrary, the construction is simplest, because it is unnecessary to provide the contact holes 29a, 29d or the contact diffusion regions 23, so the fabrication process is simple and the over all size becomes small compared to other circuits, but that the circuit requires the large capacity as mentioned above. Therefore, such circuit is convenient to be installed in an IC having a very high device packing density.

FIG. 5 shows a fifth embodiment of the protection device by the present invention. Compared to the circuit of FIG. 1, this embodiment is further provided with a p⁺-type layer 32 of about 1 $\mu$m thick in the upper part of the p⁻-type diffusion region 22. This p⁺-type layer 32 is formed with an intention further decreasing the resistance of Rw in FIG. 1(c) to further improve the high frequency characteristics of the IC. Therefore, the doping density for this layer is preferable to be as high as possible. Usually, such p⁺-type layer 32 is formed by ion implantation process after the first oxide layer (gate oxide layer) 25 is formed, or it may be formed by ordinary diffusion process after the p⁻-type diffusion region 22 is formed. The doping rate and the thickness of the layer 32 are not critical.

It will be clear to the one skilled in the art that in many cases, the contact diffusion regions 23 may be taken into the p⁺-type layer 32, when the impurity concentration of the layer 32 is higher or equal to that of the region 23, though they are shown distinguished from each other in the figure.

In the above disclosure, the description has been done mainly on the input side of the IC chip, but similar circuit may be provided on the output side, or on both input and output sides of the IC. It has also been assumed that the substrate is n-type silicon. But it will be clear to any person skilled in the art that the substrate may be p-type, and the diffusion regions 22 may be n-type. Such a modification may be done easily by replacing the conductivity type of the parts properly.

Furthermore, various modifications are possible within the spirit of the invention, for example, the combined style of FIG. 1 and FIG. 3 which has similar form to that of FIG. 1 but only one contact hole 29a is provided on the left hand side (input side) of the diffusion region 22 in the circuit of FIG. 1 and the right hand side (input circuit side) is not provided with the contact hole. Such modifications are all in the spirit and scope of the present invention.

The construction of the circuit has been described rather concentrating in the cross sectional structure of the chip, and the top viewed shape and dimensions of the circuit haves been described briefly giving only a typical example. As has been described before, they may be varied at will to meet the space where the circuit is installed.

In the design of the protection device the, following should be considered. The time constant CR of the protection circuit is the larger the better for the protection effect. But it depends on the operation speed of the circuit or the wave form of the signal which the IC intends to process, because too large a CR constant blunts the signal of the IC. Generally speaking, the CR constant of the protection device is preferable to be less than 10% of that of the I/O circuit connected to it.

Moreover the time constant CR of the circuit may be adjusted by the resistivity of the material and size of the circuit. But too high a resistance causes thermal burn out of the resistance body, and a large capacitance needs a large diffusion region and hence a large area. There must be, therefore, a compromise between them. A practical measure at present state-of-the-art is approximately 100 ohms in the resistance value. And it will be easy for the one skilled in the art to design the protection circuit along the spirit of the invention from the data given as an example in above disclosure.

The processes for fabricating the circuit have been omitted, because they are all familiar ones for fabricating ICs, and any process for fabricating IC may be applicable. Moreover, as has been described above, most of the processes are performed with the same steps at the same time as fabricating circuit elements included in the IC. Therefore, it does not need any additional step or process for fabricating the circuit of the invention.

Finally an example of the effect in the improvement of the durability of IC against the high voltage noise will be given. The test has been done by touching the I/O pins of the IC with a capacitor of 300 pF charged up to a predetermined voltage, and discharging the capacitor through the IC. This is equivalent to applying a static surge to the IC. The test was repeated increasing the charging up voltage of the capacitor until any deterioration occurs in the IC. The ICs provided with a prior art protection device and the ones provided with the circuit of FIG. 1 have been compared. Wherein the equivalent resistances of Rp and Rw were approximately 100 ohms and 12 K ohms respectively.

The results were as follows. For a negative voltage charge the ICs having a prior art protection device had been deteriorated by −380 V, but the ICs provided with the circuit of FIG. 1 had borne up to more than −480 V. For a positive voltage charge, the prior art ICs had been deteriorated by +320 V, while the ICs provided with the circuit of FIG. 1 had borne up to more than +420 V. As can be seen from these results, the effect of increasing the durability of the IC against the high voltage noise is clear.

What we claim are as follows:
1. A protection device formed on a semiconductor substrate of an IC and connected in a circuit in series with at least one of an input to and output from a circuit formed on said IC, said protection device comprising:
   a diffusion region formed on said substrate and having a conductivity type opposite to that of the substrate;
   an insulating layer covering said diffusion region;
   a resistance body composed of polysilicon formed on said insulating layer over said diffusion region so as to be electrically isolated from said substrate by said diffusion region; and
   at least one contact region formed entirely within said diffusion region comprising a layer doped at a higher rate with the same conductivity type of impurity as that of the diffusion region, said resistance body and said diffusion region being electrically connected in parallel through said contact region;
   said parallel connected resistance body and diffusion region being connected in series between at least one of an input pad and output pad and said at least one of an input to and output from a circuit.

2. A protection device according to claim 1, wherein said resistance body is formed on a first oxide layer which is fabricated in the same process used for fabricating the oxide film covering the channel region underneath the gate of a FET (Field Effect Transistor) of the IC.

3. A protection device according to claim 1, wherein said resistance body is formed on a field oxide layer of the IC.

4. A protection device according to claim 1, 2 or 3 further comprising:
   a second oxide layer covering the surface of the resistance body; and
   a passivation film coating the entire surface of the device.

5. A protection device according to claim 4, wherein said passivation film comprises a phosphosilicate glass layer.

6. A protection device according to claim 1, 2 or 3 wherein the time constant of the protection device, determined by the resistance of the resistance body, the resistance of the diffusion region and the capacitance of the resistance body to the substrate, is less than 10% of the time constant of the circuit connected to the protection device.

7. A protection device according to claim 1, wherein said diffusion region forms a diode with said substrate, said diode being biased in the reverse direction by a voltage applied to said substrate.

* * * * *